(12) United States Patent
Yang et al.

(10) Patent No.: US 11,714,112 B2
(45) Date of Patent: Aug. 1, 2023

(54) DETECTION APPARATUS FOR UNBALANCED DC LINK CAPACITOR VOLTAGE (71) Applicant: DELTA ELECTRONICS, INC., Taoyuan (TW)

(72) Inventors: Li-Ching Yang, Taoyuan (TW); Wen-Lung Huang, Taoyuan (TW); Sheng-Hua Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 182 days.

(21) Appl. No.: 17/181,662

(22) Filed: Feb. 22, 2021

(65) Prior Publication Data

US 2021/0373058 A1 Dec. 2, 2021

(30) Foreign Application Priority Data

Jun. 1, 2020 (CN) .......................... 202010484862.1

(51) Int. Cl.
G01R 27/26 (2006.01)
G01R 19/22 (2006.01)
H02M 1/00 (2006.01)
H03F 3/45 (2006.01)
H02M 7/02 (2006.01)

(52) U.S. Cl.
CPC ........ *G01R 27/2605* (2013.01); *G01R 19/22* (2013.01); *H02M 1/00* (2013.01); *H03F 3/45* (2013.01); *H02M 1/0009* (2021.05); *H02M 7/02* (2013.01); *H03F 2200/462* (2013.01)

(58) Field of Classification Search
CPC ........ H02P 6/26; G01R 31/52; G01R 31/2827
See application file for complete search history.

(56) References Cited

U.S. PATENT DOCUMENTS

| 3,757,169 | A | 9/1973 | Beresnikow | |
| 6,678,132 | B1* | 1/2004 | Carruthers | G01R 31/52 |
| | | | | 361/42 |
| 9,831,824 | B2* | 11/2017 | Gazit | H02M 7/44 |
| 2001/0054887 | A1* | 12/2001 | Baretich | H02M 5/293 |
| | | | | 323/284 |
| 2005/0180074 | A1 | 8/2005 | Doljack et al. | |

(Continued)

FOREIGN PATENT DOCUMENTS

| CN | 103199500 A | 7/2013 |
| CN | 103499728 A | 1/2014 |

*Primary Examiner* — Jermele M Hollington
*Assistant Examiner* — Temilade S Rhodes-Vivour
(74) *Attorney, Agent, or Firm* — Muncy, Geissler, Olds & Lowe, P.C.

(57) ABSTRACT

A detection apparatus for unbalanced DC link capacitor voltage, the DC link provides a DC voltage and includes a plurality of capacitors coupled in series to two ends of the DC link and a plurality of balanced resistors coupled in series to two ends of the DC link and corresponding to the capacitors. The detection apparatus includes a plurality of sense resistors and a current sensor. One end of each sense resistor is coupled to a common-connected node of two capacitors, and the other end thereof is coupled to a common-connected node of two balanced resistors. The current sensor is coupled to one of the sense resistors and measures a current value of a current flowing through the sense resistor coupled to the current sensor.

12 Claims, 8 Drawing Sheets (56) References Cited

U.S. PATENT DOCUMENTS

2016/0096433 A1* 4/2016 Gale .................... B60L 3/0069
 701/34.2
2017/0288573 A1* 10/2017 Hong ................... H02M 7/487
2017/0338735 A1* 11/2017 Alarcon-Cot ....... H02M 1/4225

* cited by examiner

DETECTION APPARATUS FOR UNBALANCED DC LINK CAPACITOR VOLTAGE

BACKGROUND

Technical Field

The present disclosure relates to an apparatus for detecting capacitor voltage, and more particular to a detection apparatus for unbalanced DC link capacitor voltage.

Description of Related Art

The statements in this section merely provide background information related to the present disclosure and do not necessarily constitute prior art.

Figure 1A:
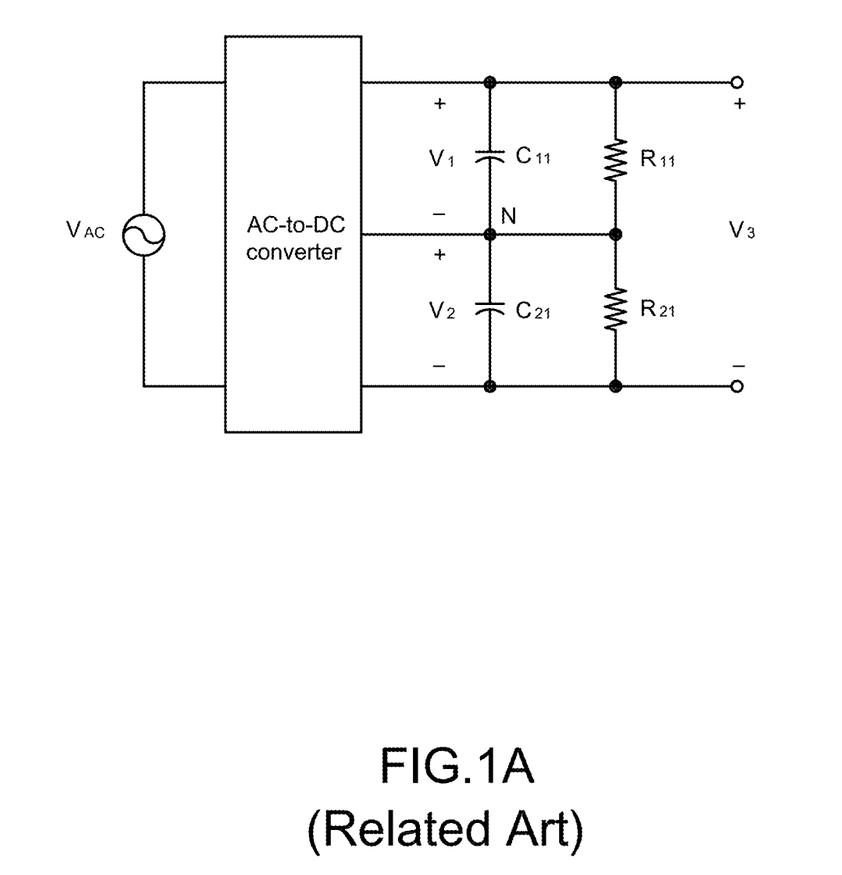
FIG. 1A is a block circuit diagram of DC link capacitor voltage distribution of a conventional single-phase AC voltage conversion.
Figure 1B:
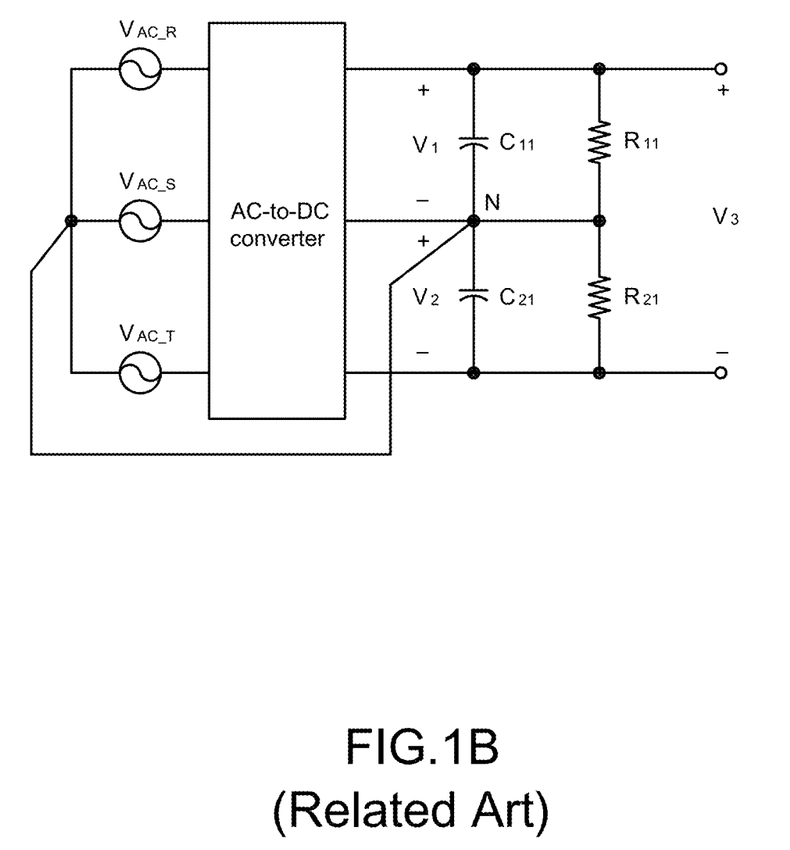
FIG. 1B is a block circuit diagram of DC link capacitor voltage distribution of a conventional three-phase AC voltage conversion.

Please refer to FIG. 1A and FIG. 1B, which show block circuit diagrams of DC link capacitor voltage distribution of a conventional single-phase AC voltage conversion and a conventional three-phase AC voltage conversion, respectively. Take the DC link capacitor voltage distribution of the conventional single-phase AC voltage conversion as an example, an AC voltage $V_{AC}$ is converted by an AC-to-DC converter, for example, but not limited to a multi-level converter to provide a first DC voltage $V_1$ and a second DC voltage $V_2$ at a DC link, or a voltage of the DC link (DC link voltage) is converted into the AC voltage $V_{AC}$ by the AC-to-DC converter. A neutral node N is formed between the first DC voltage $V_1$ across a first capacitor $C_{11}$ and the second DC voltage $V_2$ across a second capacitor $C_{21}$. Due to the three-level characteristic, the first DC voltage $V_1$ and the second DC voltage $V_2$ are limited to half of the DC link voltage $V_3$. In general, in order to make the first capacitor $C_{11}$ and the second capacitor $C_{21}$ be able to averagely withstand the DC link voltage $V_3$, a first balanced resistor $R_{11}$ is coupled in parallel to the first capacitor $C_{11}$ and a second balanced resistor $R_{21}$ is coupled in parallel to the second capacitor $C_{21}$. In particular, the DC link voltage $V_3$ may be a voltage of a DC link of any power supply product, for example, but not limited to, a solar panel, a wind-energy device, or a microgrid. Since the operation principle of the DC link capacitor voltage distribution of the conventional three-phase AC voltage conversion shown in FIG. 1B is similar to that shown in FIG. 1A, the detail description is omitted here for conciseness.

Figure 2:
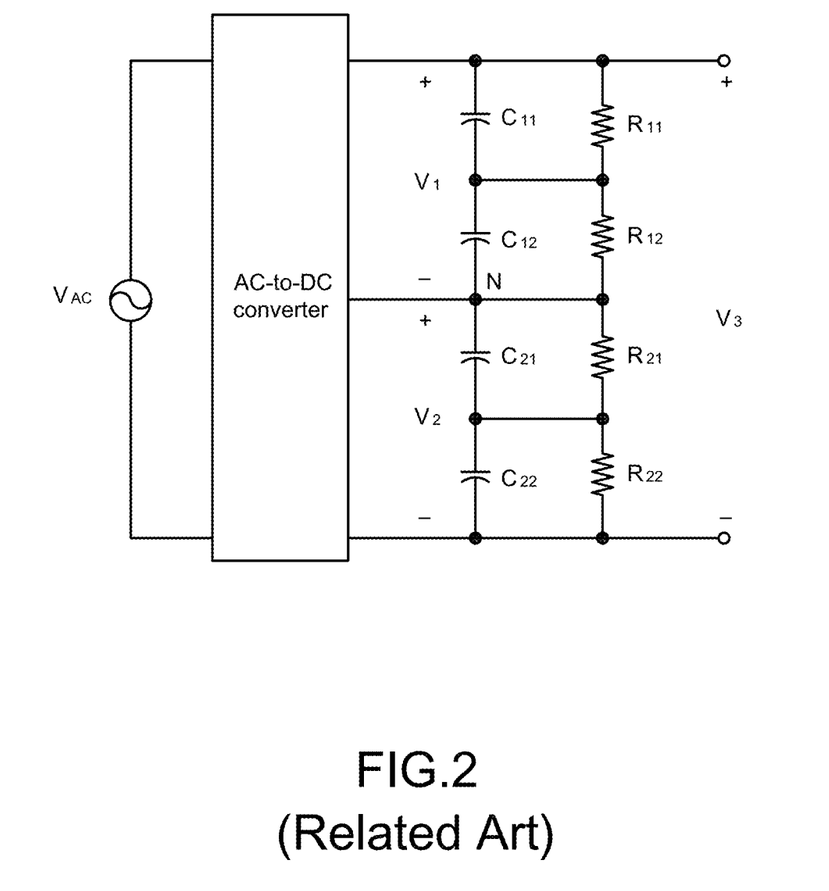
FIG. 2 is a block circuit diagram of DC link capacitor voltage distribution of another conventional single-phase AC voltage conversion.

Please refer to FIG. 2, which shows a block circuit diagram of DC link capacitor voltage distribution of another conventional single-phase AC voltage conversion. With the maximum power and efficiency of power supply products, in order to maintain the same conduction loss of internal components thereof, it is imperative to increase the voltage range of power supply products. Therefore, a plurality of capacitors coupled in series are used to accommodate the increased DC link voltage $V_3$, thereby increasing the output power of power supply products. Also, voltages at the DC link are withstood by the plurality of capacitors, that is, the first DC voltage $V_1$ is withstood by capacitors $C_{11}$, $C_{12}$ and the second DC voltage $V_2$ is withstood by capacitors $C_{21}$, $C_{22}$. In order to averagely withstand the first DC voltage $V_1$ and the second DC voltage $V_2$ by the capacitors, each capacitor is coupled in parallel to one resistor to passively average the voltages. As shown in FIG. 2, the capacitor $C_{11}$ and the capacitor $C_{12}$ are respectively coupled in parallel to a resistor Ru and a resistor $R_{12}$, and the capacitor $C_{21}$ and the capacitor $C_{22}$ are respectively coupled in parallel to a resistor $R_{21}$ and a resistor $R_{22}$. In particular, the capacitances of the capacitors $C_{11}$, $C_{12}$, $C_{21}$, $C_{22}$ are approximately equal, and the resistances of the $R_{11}$, $R_{12}$, $R_{21}$, $R_{22}$ are approximately equal.

However, once any capacitor corresponding to the first DC voltage $V_1$ or the second DC voltage $V_2$ is open-circuit or short-circuit, the voltage of the abnormal capacitor will be withstood on other capacitors or components so as to damage these capacitors or components. In order to solve the problem, the current technology mainly uses the feedback mechanism for detecting the voltage of each capacitor, thereby determining whether the voltages are abnormal or not. However, the cost of the voltage detection using the feedback mechanism is higher, and it causes the increase of uncertainties in the feedback control. Furthermore, the greater the number of series-connected capacitors, the lower the efficiency of the current technology.

SUMMARY

An object of the present disclosure is to provide a detection apparatus for unbalanced DC link capacitor voltage to solve the above-mentioned problems.

In order to achieve the above-mentioned object, the DC link provides a DC voltage and has a plurality of capacitors coupled in series to two ends of the DC link and a plurality of balanced resistors coupled in series to two ends of the DC link and corresponding to the capacitors. The detection apparatus includes a plurality of sense resistors and a current sensor. One end of each sense resistor is coupled to a common-connected node of two capacitors, and the other end of each sense resistor is coupled to a common-connected node of two balanced resistors. The current sensor is coupled to one of the sense resistors, and measures a current value of a current flowing through the sense resistor coupled to the current sensor.

In one embodiment, the DC voltage is acquired by converting an AC voltage by an AC-to-DC converter, or the DC voltage is provided to the AC-to-DC converter and converted into the AC voltage.

In one embodiment, the AC-to-DC converter is a multi-level converter.

In one embodiment, the DC voltage is acquired by converting another DC voltage by a DC-to-DC converter, or the DC voltage is provided to the DC-to-DC converter and converted into the another DC voltage.

In one embodiment, the current sensor is a Hall-effect current sensor or a current sense amplifier.

In one embodiment, the DC voltage is greater than 1000 volts.

Accordingly, the detection apparatus for unbalanced DC link capacitor voltage is provided to determine whether the DC voltage withstood by a plurality of capacitors is balanced or not and to eliminate the situation of abnormal voltage.

Another object of the present disclosure is to provide a detection apparatus for unbalanced DC link capacitor voltage to solve the above-mentioned problems.

In order to achieve the above-mentioned object, the DC link has a neutral node and provides a first DC voltage and a second DC voltage, and has a plurality of capacitors coupled in series to two ends of the DC link and a plurality of balanced resistors coupled in series to two ends of the DC link and corresponding to the capacitors. The detection apparatus includes a plurality of sense resistors and a current sensor. One end of each sense resistor is coupled to a common-connected node of two capacitors, and the other end of each sense resistor is coupled to a common-connected node of two balanced resistors. The current sensor is coupled to one of the sense resistors, and measures a current value of a current flowing through the sense resistor coupled to the current sensor.

In one embodiment, the first DC voltage and the second DC voltage are acquired by converting an AC voltage by an AC-to-DC converter, or the first DC voltage and the second DC voltage are provided to the AC-to-DC converter and converted into the AC voltage; the AC-to-DC converter is a multi-level converter.

In one embodiment, the current sensor is a Hall-effect current sensor or a current sense amplifier.

Accordingly, the detection apparatus for unbalanced DC link capacitor voltage is provided to determine whether the DC voltage withstood by a plurality of capacitors is balanced or not and to eliminate the situation of abnormal voltage.

Further another object of the present disclosure is to provide a detection apparatus for unbalanced DC link capacitor voltage to solve the above-mentioned problems.

In order to achieve the above-mentioned object, the DC link has a neutral node and provides a first DC voltage and a second DC voltage, and has a plurality of capacitors coupled in series to two ends of the DC link and a plurality of balanced resistors coupled in series to two ends of the DC link and corresponding to the capacitors. The detection apparatus includes a plurality of sense resistors, a first current sensor, and a second current sensor. One end of each sense resistor is coupled to a common-connected node of two capacitors, and the other end of each sense resistor is coupled to a common-connected node of two balanced resistors. No sense resistor is coupled to the neutral node. The first current sensor is coupled to one of the sense resistors corresponding to the first DC voltage, and measures a first current value of a current flowing through the sense resistor coupled to the first current sensor. The second current sensor is coupled to one of the sense resistors corresponding to the second DC voltage, and measures a second current value of a current flowing through the sense resistor coupled to the second current sensor.

In one embodiment, the first DC voltage and the second DC voltage are acquired by converting an AC voltage by an AC-to-DC converter, or the first DC voltage and the second DC voltage are provided to the AC-to-DC converter and converted into the AC voltage; the AC-to-DC converter is a multi-level converter.

In one embodiment, the first current sensor and the second current sensor are a Hall-effect current sensor or a current sense amplifier.

Accordingly, the detection apparatus for unbalanced DC link capacitor voltage is provided to determine whether the first DC voltage and the second DC voltage withstood by a plurality of capacitors are balanced or not and to eliminate the situation of abnormal voltage.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Reference will now be made to the drawing figures to describe the present disclosure in detail. It will be understood that the drawing figures and exemplified embodiments of present disclosure are not limited to the details thereof.

Figure 3:
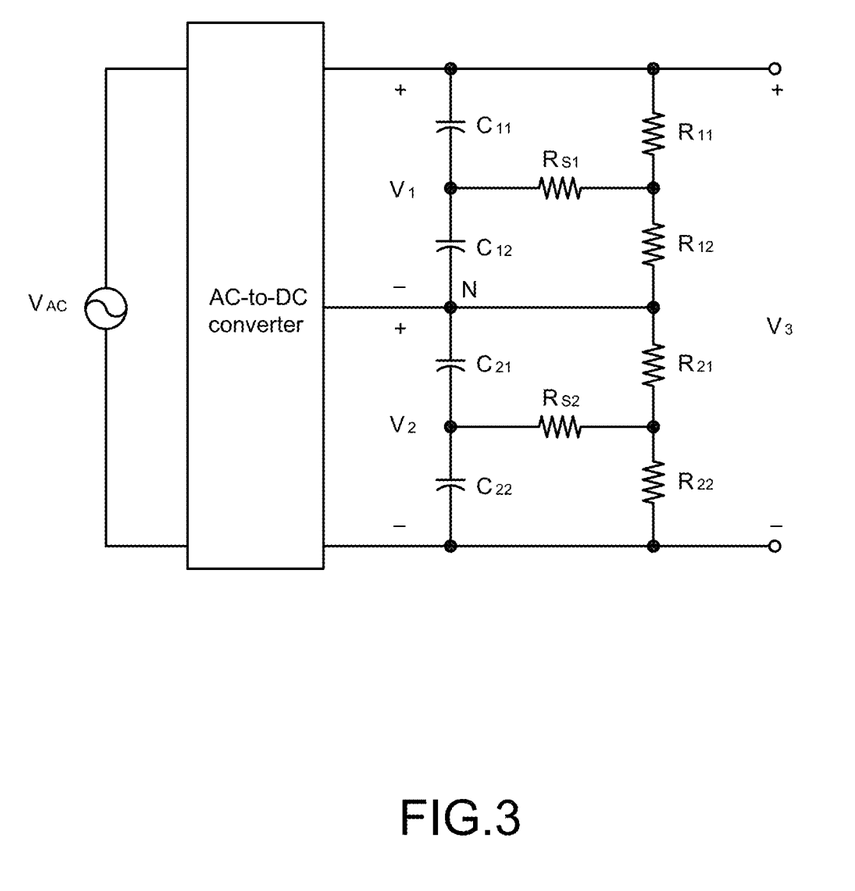
FIG. 3 is a block circuit diagram of a detection apparatus for unbalanced DC link capacitor voltage according to the present disclosure.

Please refer to FIG. 3, which shows a block circuit diagram of a detection apparatus for unbalanced DC link capacitor voltage according to the present disclosure. In order to detect whether a first DC voltage $V_1$ and a second DC voltage $V_2$ are unbalanced at a DC link of an AC-to-DC converter, sense resistors $R_{S1}$, $R_{S2}$ are used. In particular, one end of the sense resistor $R_{S1}$ is coupled to a common-connected node of two capacitors $C_{11}$, $C_{12}$, and the other end of the sense resistor $R_{S1}$ is coupled to a common-connected node of two balanced resistors $R_{11}$, $R_{12}$. Similarly, one end of the sense resistor $R_{S2}$ is coupled to a common-connected node of two capacitors $C_{21}$, $C_{22}$, and the other end of the sense resistor $R_{S2}$ is coupled to a common-connected node of two balanced resistors $R_{21}$, $R_{22}$.

The principle of using the sense resistors $R_{S1}$, $R_{S2}$ to determine whether the first DC voltage $V_1$ and the second DC voltage $V_2$ are unbalanced is as follows. Take the first DC voltage $V_1$ as an example. When voltages of the capacitors (i.e., the capacitors $C_{11}$, $C_{12}$) corresponding to the first DC voltage $V_1$ are balanced, no current flows through the sense resistor $R_{S1}$, and therefore a voltage across the sense resistor $R_{S1}$ is zero volt.

If any voltage of the capacitor is abnormal, there is current instantly flowing through the sense resistor $R_{S1}$, and therefore a voltage across the sense resistor $R_{S1}$ is generated. For example, it is assumed that the first DC voltage $V_1$ is 2000 volts, and a withstand voltage of the capacitor $C_{11}$ is 900 volts and a withstand voltage of the capacitor $C_{12}$ is 1100 volts. It is apparent that unbalanced voltage occurs since the withstand voltage of the capacitor $C_{11}$ and that of the capacitor $C_{12}$ should be 1000 volts when voltages of the capacitors C11, C12 are balanced. At this condition, a current flows through the capacitor $C_{12}$, the sense resistor $R_{S1}$, and the balanced resistor $R_{12}$, and another current flows through the balanced resistor $R_{11}$, the capacitor $C_{11}$, and the sense resistor $R_{S1}$. For the sense resistor $R_{S1}$, a net current flowing through the sense resistor $R_{S1}$ from left to right (see from the frontal view of FIG. 3) is equal to the sum of the two currents. Therefore, if the current flowing through the sense resistor $R_{S1}$ is not zero, it represents that voltages of the capacitors (i.e., the capacitors C11, C12) corresponding to the first DC voltage $V_1$ are not balanced. Similarly, it is assumed that the first DC voltage $V_1$ is 2000 volts, and a withstand voltage of the capacitor $C_{11}$ is 1100 volts and a withstand voltage of the capacitor $C_{12}$ is 900 volts. It is apparent that unbalanced voltage occurs since the withstand voltage of the capacitor $C_{11}$ and that of the capacitor $C_{12}$ should be 1000 volts when voltages of the capacitors C11, C12 are balanced. At this condition, a current flows through the capacitor $C_{11}$, the balanced resistor $R_{11}$, and the sense resistor $R_{S1}$, and another current flows through the balanced resistor Ru, the sense resistor $R_{S1}$, and the capacitor Cu. For the sense resistor $R_{S1}$, a net current flowing through the sense resistor $R_{S1}$ from right to left (see from the frontal view of FIG. 3) is equal to the sum of the two currents. Therefore, if the current flowing through the sense resistor $R_{S1}$ is not zero, it represents that voltages of the capacitors (i.e., the capacitors C11, C12) corresponding to the first DC voltage $V_1$ are not balanced.

Figure 7:
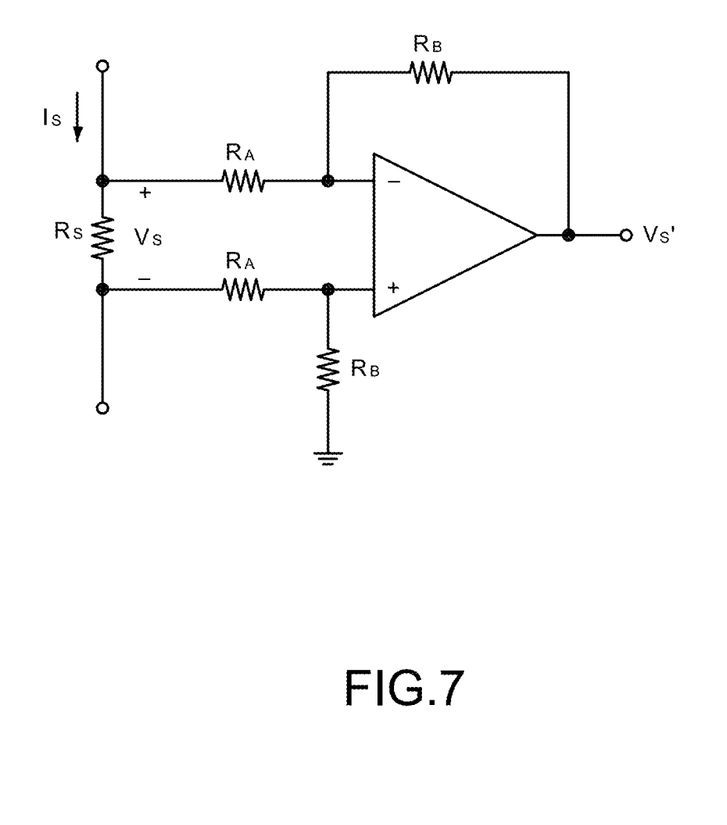
FIG. 7 is a circuit diagram of a current sense amplifier of the present disclosure.

Therefore, as long as a current sensor, such as but not limited to a Hall-effect current sensor or a current sense amplifier implemented by an OPA shown in FIG. 7, is provided with the sense resistor $R_{S1}$, it can measure whether a current flowing through the sense resistor $R_{S1}$ is zero to determine whether voltages of capacitors are balanced. For the current sense amplifier shown in FIG. 7, as long as a current flowing through the sense resistor $R_S$ is zero, i.e., a current value $I_S$ of the current is zero, a voltage across the sense resistor $R_S$ is zero (i.e., $V_S$ is zero), and therefore an output voltage $V_S'$ amplified/gained by resistor $R_B$ and resistor $R_A$ is also zero. On the contrary, as long as the current value $I_S$ of the current is not zero, the voltage across the sense resistor $R_S$ is not zero (i.e., $V_S$ is not zero), and therefore the output voltage $V_S'$ amplified/gained by resistor $R_B$ and resistor $R_A$ is also not zero. Accordingly, it can determine whether voltages of the capacitors (i.e., the capacitors C11, C12) corresponding to the first DC voltage $V_1$ are balanced or not. Further, since the operation manner of the sense resistor $R_{S2}$ is the same as that of the sense resistor $R_{S1}$, the detail description is omitted here for conciseness.

Figure 4:
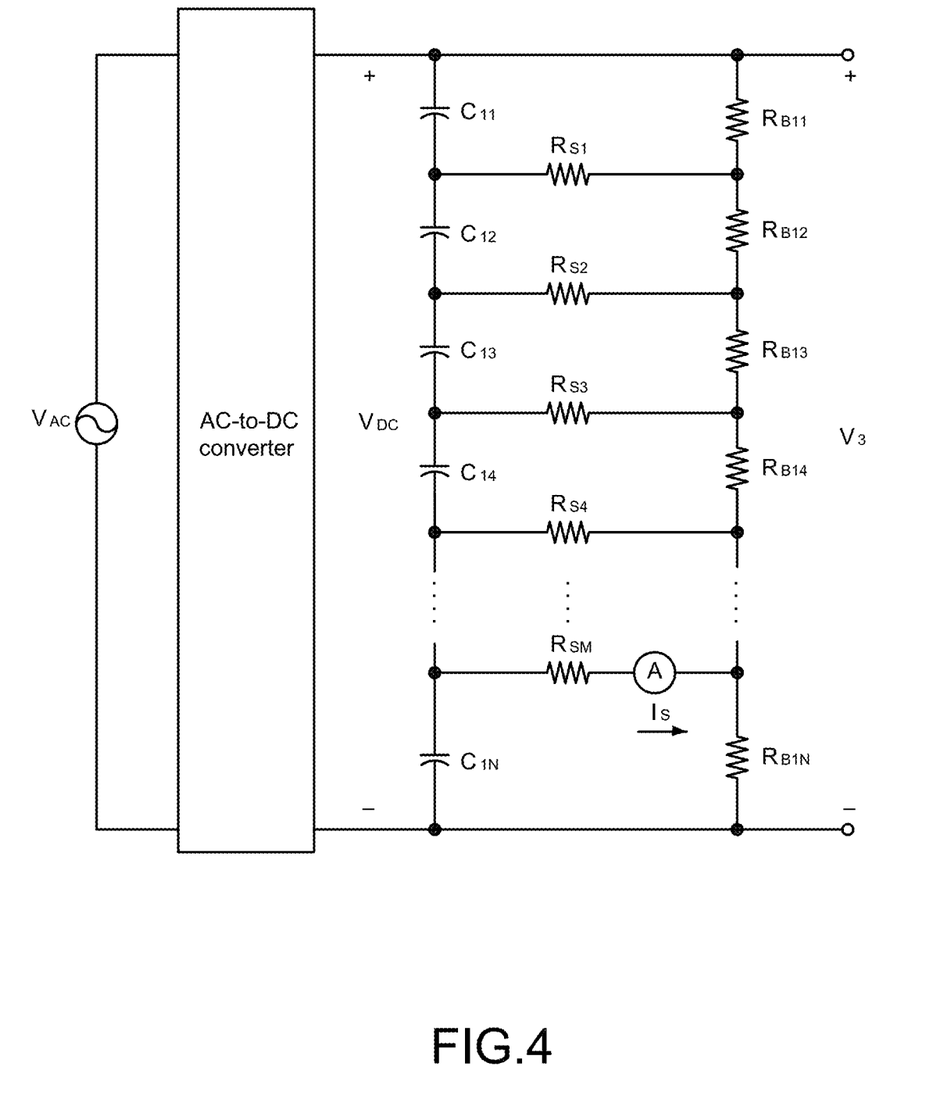
FIG. 4 is a block circuit diagram of the detection apparatus for unbalanced DC link capacitor voltage according to a first embodiment of the present disclosure.

Please refer to FIG. 4, which shows a block circuit diagram of the detection apparatus for unbalanced DC link capacitor voltage according to a first embodiment of the present disclosure. The DC link provides a DC voltage $V_{DC}$. In particular, the DC voltage $V_{DC}$ may be a DC voltage outputted from an AC-to-DC converter, such as a multi-level converter, by converting an AC voltage $V_{AC}$ by the AC-to-DC converter. Alternatively, the DC voltage $V_{DC}$ may be acquired by converting another DC voltage by a DC-to-DC converter, or the DC voltage $V_{DC}$ may be provided to the DC-to-DC converter and converted into the another DC voltage. In particular, the DC voltage $V_{DC}$ is greater than 1000 volts. Furthermore, as shown in FIG. 4, the DC link capacitor voltage distribution of a single-phase AC voltage conversion is exemplified. In different applications, it can also be the DC link capacitor voltage distribution of a three-phase AC voltage conversion (refer to FIG. 1B).

Refer to FIG. 4 again, the circuit structure includes capacitors $C_{11}$-$C_{1N}$, balanced resistors $R_{B11}$-$R_{B1N}$, sense resistors $R_{S1}$-$R_{SM}$, and a current sensor A. The capacitors $C_{11}$-$C_{1N}$ are coupled in series to form the DC link and to averagely withstand the DC voltage $V_{DC}$. The balanced resistors $R_{B11}$-$R_{B1N}$ are coupled in series and correspond to the capacitors $C_{11}$-$C_{1N}$. For example, the balanced resistor $R_{B11}$ corresponds to the capacitor $C_{11}$, and so forth, the balanced resistor $R_{B1N}$ corresponds to the capacitor $C_{1N}$. One end of each sense resistor $R_{S1}$-$R_{SM}$ is coupled to a common-connected node of two capacitors $C_{11}$-$C_{1N}$ and the other end of each sense resistor $R_{S1}$-$R_{SM}$ is coupled to a common-connected node of two balanced resistors $R_{B11}$-$R_{B1N}$. For example, one end of the sense resistor $R_{S1}$ is coupled to a common-connected node of the capacitor $C_{11}$ and the capacitor $C_{12}$, and the other end of the sense resistor $R_{S1}$ is coupled to a common-connected node of the balanced resistor $R_{B11}$ and the balanced resistor $R_{B12}$. The current sensor A is coupled to one of the sense resistors $R_{S1}$-$R_{SM}$ and measures a current value of a current flowing through the sense resistor $R_{S1}$-$R_{SM}$ coupled to the current sensor A. As shown in FIG. 4, the current sensor A is used to measure a current value $I_S$ of a current flowing through the sense resistor $R_{SM}$.

If the current value $I_S$ is not zero, the detection apparatus detects that voltages withstood by capacitors $C_{11}$-$C_{1N}$ are not balanced. On the contrary, if the current value $I_S$ is zero, the detection apparatus detects that voltages withstood by capacitors $C_{11}$-$C_{1N}$ are balanced. In this embodiment, the number of the capacitors $C_{11}$-$C_{1N}$ and the number of the balanced resistors $R_{B11}$-$R_{B1N}$ are N, and the number of the sense resistors $R_{S1}$-$R_{SM}$ is M, and M=N−1. As shown in FIG. 4, although the current sensor A is coupled to the sense resistor $R_{SM}$ and provided to measure a current value of a current flowing through the sense resistor $R_{SM}$ for determining whether the DC voltage $V_{DC}$ withstood by the capacitors $C_{11}$-$C_{1N}$ are balanced or not. Alternatively, the current sensor A can also be coupled to other sense resistors. Also, according to the net current flowing through the sense resistor mentioned above, once the DC voltage $V_{DC}$ withstood by any one of the capacitors $C_{11}$-$C_{1N}$ is unbalanced, it can be determined by a non-zero current value measured by the current sensor A.

Figure 5:
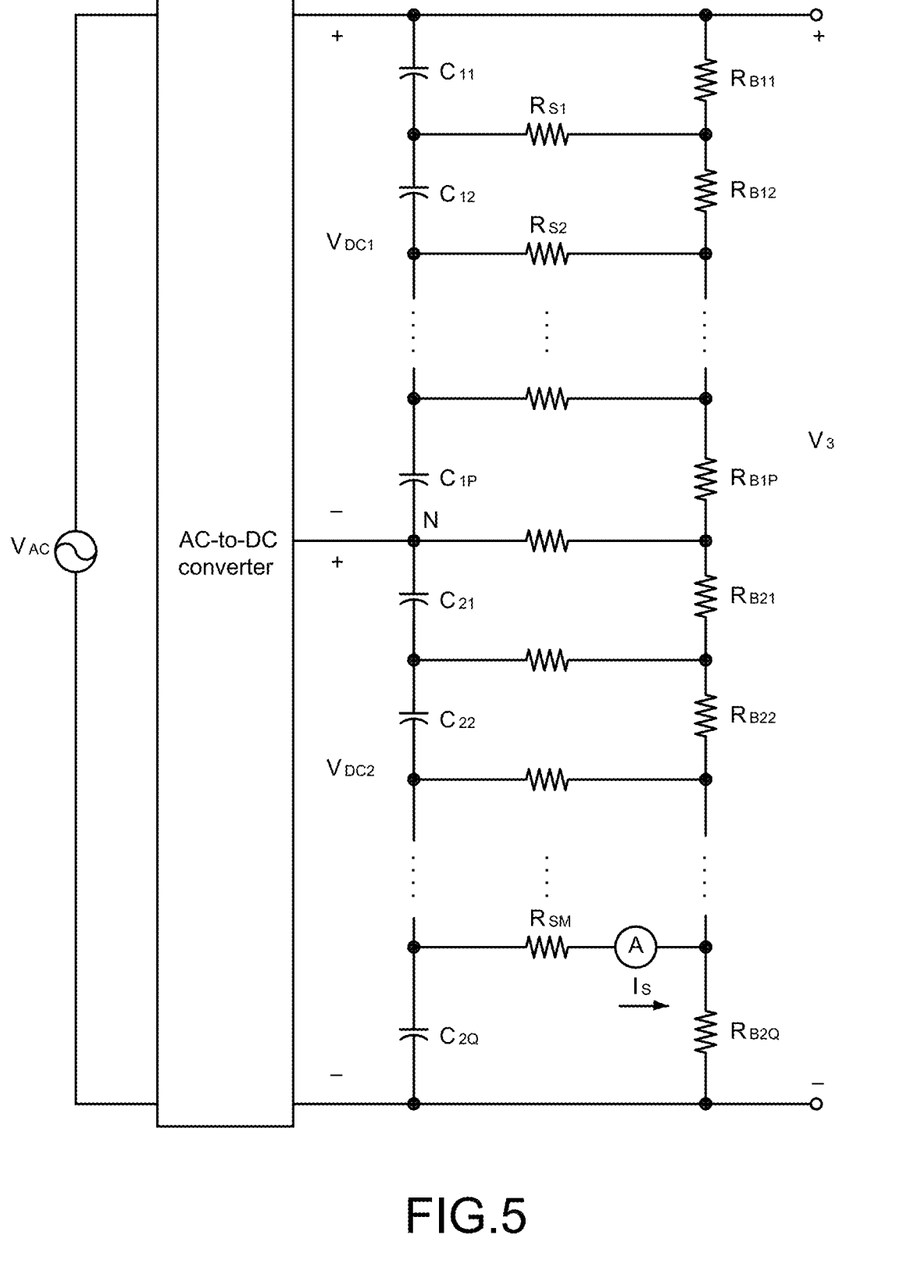
FIG. 5 is a block circuit diagram of the detection apparatus for unbalanced DC link capacitor voltage according to a second embodiment of the present disclosure.

Please refer to FIG. 5, which shows a block circuit diagram of the detection apparatus for unbalanced DC link capacitor voltage according to a second embodiment of the present disclosure. The DC link has a neutral node N and provides a first DC voltage $V_{DC1}$ and a second DC voltage $V_{DC2}$. In particular, a sum voltage of the first DC voltage $V_{DC1}$ and the second DC voltage $V_{DC2}$ may be a DC link voltage $V_3$ outputted from an AC-to-DC converter, such as a multi-level converter, by converting an AC voltage $V_{AC}$ by the AC-to-DC converter. Alternatively, the sum voltage of the first DC voltage $V_{DC1}$ and the second DC voltage $V_{DC2}$ may be another DC link voltage $V_3$ by converting a DC voltage by a DC-to-DC converter. In particular, the first DC voltage $V_{DC1}$ and the second DC voltage $V_{DC2}$ are greater than 1000 volts. Furthermore, as shown in FIG. 5, the DC link capacitor voltage distribution of a single-phase AC voltage conversion is exemplified. In different applications, it can also be the DC link capacitor voltage distribution of a three-phase AC voltage conversion (refer to FIG. 1B).

Refer to FIG. 5 again, the circuit structure includes capacitors $C_{11}$-$C_{1P}$, $C_{21}$-$C_{2Q}$, balanced resistors $R_{B11}$-$R_{B1P}$, $R_{B21}$-$R_{B2Q}$, sense resistors $R_{S1}$-$R_{SM}$, and a current sensor A. The capacitors $C_{11}$-$C_{1P}$, $C_{21}$-$C_{2Q}$ are coupled in series to form the DC link and to averagely withstand the first DC voltage $V_{DC1}$ and the second DC voltage $V_{DC2}$, that is, the capacitors $C_{11}$-$C_{1P}$ averagely withstand the first DC voltage $V_{DC1}$ and the capacitors $C_{21}$-$C_{2Q}$ averagely withstand the second DC voltage $V_{DC2}$. The balanced resistors $R_{B11}$-$R_{B1P}$, $R_{B21}$-$R_{B2Q}$ are coupled in series and correspond to the capacitors $C_{11}$-$C_{1P}$, $C_{21}$-$C_{2Q}$. For example, the balanced resistor $R_{B11}$ corresponds to the capacitor $C_{11}$, and so forth, the balanced resistor $R_{B2Q}$ corresponds to the capacitor $C_{2Q}$. One end of each sense resistor $R_{S1}$-$R_{SM}$ is coupled to a common-connected node of two capacitors $C_{11}$-$C_{1P}$, $C_{21}$-$C_{2Q}$ and the other end of each sense resistor $R_{S1}$-$R_{SM}$ is coupled to a common-connected node of two balanced resistors $R_{B11}$-$R_{B1P}$, $R_{B21}$-$R_{B2Q}$. For example, one end of the sense resistor $R_{S1}$ is coupled to a common-connected node of the capacitor $C_{11}$ and the capacitor $C_{12}$, and the other end of the sense resistor $R_{S1}$ is coupled to a common-connected node of the balanced resistor $R_{B11}$ and the balanced resistor $R_{B12}$. The current sensor A is coupled to one of the sense resistors $R_{S1}$-$R_{SM}$ and measures a current value of a current flowing through the sense resistor $R_{S1}$-$R_{SM}$ coupled to the current sensor A. As shown in FIG. 5, the current sensor A is used to measure a current value $I_s$ of a current flowing through the sense resistor $R_{SM}$.

If the current value $I_S$ is not zero, the detection apparatus detects that voltages withstood by capacitors $C_{11}$-$C_{1P}$, $C_{21}$-$C_{2Q}$ are not balanced. On the contrary, if the current value $I_S$ is zero, the detection apparatus detects that voltages withstood by capacitors $C_{11}$-$C_{1P}$, $C_{21}$-$C_{2Q}$ are balanced. In this embodiment, the number of the capacitors $C_{11}$-$C_{1P}$, $C_{21}$-$C_{2Q}$ and the number of the balanced resistors $R_{B11}$-$R_{B1P}$, $R_{B21}$-$R_{B2Q}$ are P+Q, and the number of the sense resistors $R_{S1}$-$R_{SM}$ is M, and M=P+Q−1. As shown in FIG. 5, although the current sensor A is coupled to the sense resistor $R_{SM}$ and provided to measure a current value of a current flowing through the sense resistor $R_{SM}$ for determining whether the first DC voltage $V_{DC1}$ withstood by the capacitors $C_{11}$-$C_{1P}$ and the second DC voltage $V_{DC2}$ withstood by the capacitors $C_{21}$-$C_{2Q}$ are balanced or not. Alternatively, the current sensor A can also be coupled to other sense resistors. Also, according to the net current flowing through the sense resistor mentioned above, once the first DC voltage $V_{DC1}$ withstood by any one of the capacitors $C_{11}$-$C_{1P}$ or the second DC voltage $V_{DC2}$ withstood by any one of the capacitors $C_{21}$-$C_{2Q}$ is unbalanced, it can be determined by a non-zero current value measured by the current sensor A.

Figure 6:
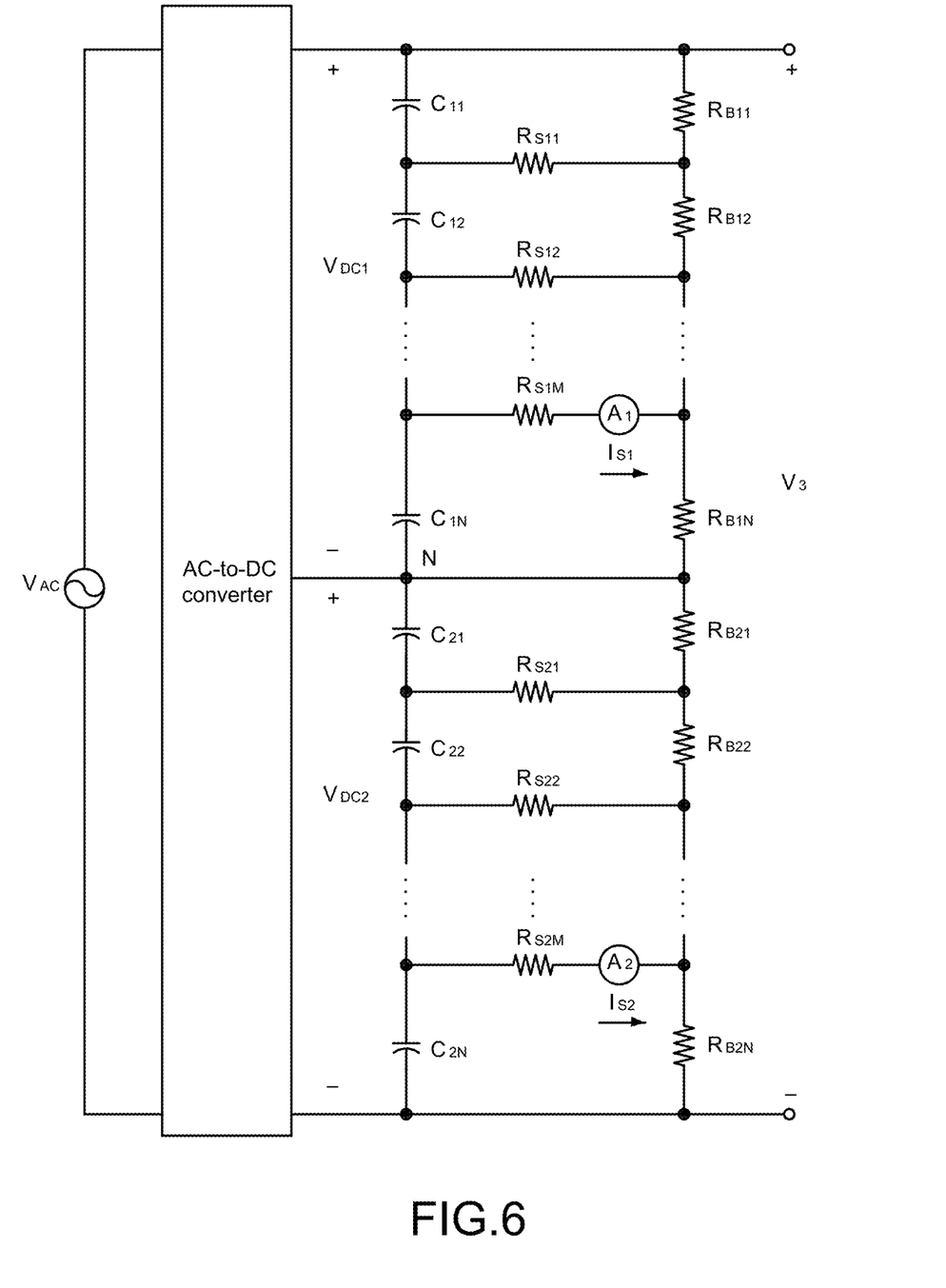
FIG. 6 is a block circuit diagram of the detection apparatus for unbalanced DC link capacitor voltage according to a third embodiment of the present disclosure.

Please refer to FIG. 6, which shows a block circuit diagram of the detection apparatus for unbalanced DC link capacitor voltage according to a third embodiment of the present disclosure. The DC link has a neutral node N and provides a first DC voltage $V_{DC1}$ and a second DC voltage $V_{DC2}$. In particular, the first DC voltage $V_{DC1}$ and the second DC voltage $V_{DC2}$ may be voltages outputted from an AC-to-DC converter, such as a multi-level converter, by converting an AC voltage $V_{AC}$ by the AC-to-DC converter. Alternatively, the first DC voltage $V_{DC1}$ and the second DC voltage $V_{DC2}$ may be another DC voltage by converting a DC voltage by a DC-to-DC converter. In particular, the first DC voltage $V_{DC1}$ and the second DC voltage $V_{DC2}$ are greater than 1000 volts. Furthermore, as shown in FIG. 6, the DC link capacitor voltage distribution of a single-phase AC voltage conversion is exemplified. In different applications, it can also be the DC link capacitor voltage distribution of a three-phase AC voltage conversion (refer to FIG. 1B).

Refer to FIG. 6 again, the circuit structure includes capacitors $C_{11}$-$C_{1N}$, $C_{21}$-$C_{2N}$, balanced resistors $R_{B11}$-$R_{B1N}$, $R_{B21}$-$R_{B2N}$, sense resistors $R_{S11}$-$R_{S1M}$, $R_{S21}$-$R_{S2M}$, a first current sensor $A_1$, and a second current sensor $A_2$. The capacitors $C_{11}$-$C_{1N}$, $C_{21}$-$C_{2N}$ are coupled in series to form the DC link and to averagely withstand the first DC voltage $V_{DC1}$ and the second DC voltage $V_{DC2}$, that is, the capacitors $C_{11}$-$C_{1N}$ averagely withstand the first DC voltage $V_{DC1}$ and the capacitors $C_{21}$-$C_{2N}$ averagely withstand the second DC voltage $V_{DC2}$. The balanced resistors $R_{B11}$-$R_{B1N}$, $R_{B21}$-$R_{B2N}$ are coupled in series and correspond to the capacitors $C_{11}$-$C_{1N}$, $C_{21}$-$C_{2N}$. For example, the balanced resistor $R_{B11}$ corresponds to the capacitor $C_{11}$, and so forth, the balanced resistor $R_{B2N}$ corresponds to the capacitor $C_{2N}$. One end of each sense resistor $R_{S11}$-$R_{S1M}$, $R_{S21}$-$R_{S2M}$ is coupled to a common-connected node of two capacitors $C_{11}$-$C_{1N}$, $C_{21}$-$C_{2N}$ and the other end of each sense resistor $R_{S11}$-$R_{S1M}$, $R_{S21}$-$R_{S2M}$ is coupled to a common-connected node of two balanced resistors $R_{B11}$-$R_{B1N}$, $R_{B21}$-$R_{B2N}$. However, no sense resistor $R_{S11}$-$R_{S1M}$, $R_{S21}$-$R_{S2M}$ is coupled to the neutral node N. For example, one end of the sense resistor $R_{S11}$ is coupled to a common-connected node of the capacitor $C_{11}$ and the capacitor $C_{12}$, and the other end of the sense resistor $R_{S11}$ is coupled to a common-connected node of the balanced resistor $R_{B11}$ and the balanced resistor $R_{B12}$. The first current sensor $A_1$ is coupled to one of the sense resistors $R_{S11}$-$R_{S1M}$ corresponding to the first DC voltage $V_{DC1}$ and measures a current value of a current flowing through the sense resistor $R_{S11}$-$R_{S1M}$ coupled to the first current sensor $A_1$. As shown in FIG. 6, the first current sensor $A_1$ is used to measure a first current value $I_{S1}$ of a current flowing through the sense resistor $R_{S1M}$. If the first current value $I_{S1}$ is not zero, the detection apparatus detects that the first DC voltage $V_{DC1}$ withstood by the capacitors $C_{11}$-$C_{1N}$ is not balanced. On the contrary, if the first current value Isi is zero, the detection apparatus detects that the first DC voltage $V_{DC1}$ withstood by the capacitors $C_{11}$-$C_{1N}$ is balanced.

The second current sensor $A_2$ is coupled to one of the sense resistors $R_{S21}$-$R_{S2M}$ corresponding to the second DC voltage $V_{DC2}$ and measures a current value of a current flowing through the sense resistor $R_{S21}$-$R_{S2M}$ coupled to the second current sensor $A_2$. As shown in FIG. 6, the second current sensor $A_2$ is used to measure a second current value $I_{S2}$ of a current flowing through the sense resistor $R_{S2M}$. If the second current value $I_{S2}$ is not zero, the detection apparatus detects that the second DC voltage $V_{DC2}$ withstood by the capacitors $C_{21}$-$C_{2N}$ is not balanced. On the contrary, if the second current value $I_{S2}$ is zero, the detection apparatus detects that the second DC voltage $V_{DC2}$ withstood by the capacitors $C_{21}$-$C_{2N}$ is balanced. In this embodiment, the number of the capacitors $C_{11}$-$C_{1N}$, $C_{21}$-$C_{2N}$ and the number of the balanced resistors $R_{B11}$-$R_{B1N}$, $R_{B21}$-$R_{B2N}$ are 2N, and the number of the sense resistors $R_{S11}$-$R_{S1M}$, $R_{S21}$-$R_{S2M}$ is 2M, and M=N−1. As shown in FIG. 6, although the first current sensor $A_1$ is coupled to the sense resistor $R_{S1M}$ and provided to measure a current value of a current flowing through the sense resistor $R_{S1M}$ for determining whether the first DC voltage $V_{DC1}$ withstood by the capacitors $C_{11}$-$C_{1N}$ is balanced or not. Alternatively, the first current sensor $A_1$ can also be coupled to other sense resistors. Also, according to the net current flowing through the sense resistor mentioned above, once the first DC voltage $V_{DC1}$ withstood by any one of the capacitors $C_{11}$-$C_{1N}$ is unbalanced, it can be determined by a non-zero current value measured by the first current sensor $A_1$. Similarly, although the second current sensor $A_2$ is coupled to the sense resistor $R_{S2M}$ and provided to measure a current value of a current flowing through the sense resistor $R_{S2M}$ for determining whether the second DC voltage $V_{DC2}$ withstood by the capacitors $C_{21}$-$C_{2N}$ is balanced or not. Alternatively, the second current sensor $A_2$ can also be coupled to other sense resistors. Also, according to the net current flowing through the sense resistor mentioned above, once the second DC voltage $V_{DC2}$ withstood by any one of the capacitors $C_{21}$-$C_{2N}$ is unbalanced, it can be determined by a non-zero current value measured by the second current sensor $A_2$.

The above-mentioned embodiments (examples) are described in an ideal situation. However, in actual situations, the net current flowing through the sense resistor may be not equal to zero even if the voltage withstood by the capacitors is balanced because of the tolerance of component values of the capacitors and the balanced resistors. Therefore, a non-zero threshold current value Ith can be provided to determine whether the voltage withstood by the capacitors is balanced or not. Specifically, when the net current measured by the current sensor is greater than (or equal to) the threshold current value Ith, the voltage withstood by the capacitors is determined to be unbalanced.

In conclusion, the present disclosure has following features and advantages:

1. The detection apparatus for unbalanced DC link capacitor voltage can be applied to the DC link capacitor voltage distribution of a single-phase and a three-phase AC voltage conversion.

2. Since the detection circuit and the main circuit are not overlapped, the operation of the main circuit will not be affected by the detection circuit and the operation of circuit control will not be affected by the detection manner.

3. For multiple capacitors connected in series, it is only necessary to measure current value(s) of flowing through one or two sense resistors to determine whether the voltage withstood by the capacitors is balanced or not.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A detection apparatus for unbalanced DC link capacitor voltage, the DC link providing a DC voltage, and having a plurality of capacitors coupled in series to two ends of the DC link and a plurality of balanced resistors coupled in series to two ends of the DC link and corresponding to the capacitors, the detection apparatus comprising:
   a plurality of sense resistors, one end of each sense resistor coupled to a common-connected node of two capacitors, and the other end of each sense resistor coupled to a common-connected node of two balanced resistors, and
   a current sensor coupled to one of the sense resistors, and configured to measure a current value of a current flowing through the sense resistor coupled to the current sensor.

2. The detection apparatus for unbalanced DC link capacitor voltage in claim 1, wherein the DC voltage is acquired by converting an AC voltage by an AC-to-DC converter, or the DC voltage is provided to the AC-to-DC converter and converted into the AC voltage.

3. The detection apparatus for unbalanced DC link capacitor voltage in claim 2, wherein the AC-to-DC converter is a multi-level converter.

4. The detection apparatus for unbalanced DC link capacitor voltage in claim 1, wherein the DC voltage is acquired by converting another DC voltage by a DC-to-DC converter, or the DC voltage is provided to the DC-to-DC converter and converted into the another DC voltage.

5. The detection apparatus for unbalanced DC link capacitor voltage in claim 1, wherein the current sensor is a Hall-effect current sensor or a current sense amplifier.

6. The detection apparatus for unbalanced DC link capacitor voltage in claim 1, wherein the DC voltage is greater than 1000 volts.

7. A detection apparatus for unbalanced DC link capacitor voltage, the DC link having a neutral node and providing a first DC voltage and a second DC voltage, and having a plurality of capacitors coupled in series to two ends of the DC link and a plurality of balanced resistors coupled in series to two ends of the DC link and corresponding to the capacitors, the detection apparatus comprising:
   a plurality of sense resistors, one end of each sense resistor coupled to a common-connected node of two capacitors, and the other end of each sense resistor coupled to a common-connected node of two balanced resistors, and
   a current sensor coupled to one of the sense resistors, and configured to measure a current value of a current flowing through the sense resistor coupled to the current sensor.

8. The detection apparatus for unbalanced DC link capacitor voltage in claim 7, wherein the first DC voltage and the second DC voltage are acquired by converting an AC voltage by an AC-to-DC converter, or the first DC voltage and the second DC voltage are provided to the AC-to-DC converter and converted into the AC voltage; the AC-to-DC converter is a multi-level converter.

9. The detection apparatus for unbalanced DC link capacitor voltage in claim 7, wherein the current sensor is a Hall-effect current sensor or a current sense amplifier.

10. A detection apparatus for unbalanced DC link capacitor voltage, the DC link having a neutral node and providing a first DC voltage and a second DC voltage, and having a plurality of capacitors coupled in series to two ends of the DC link and a plurality of balanced resistors coupled in series to two ends of the DC link and corresponding to the capacitors, the detection apparatus comprising:
   a plurality of sense resistors, one end of each sense resistor coupled to a common-connected node of two capacitors, and the other end of each sense resistor coupled to a common-connected node of two balanced resistors; no sense resistor is coupled to the neutral node,
   a first current sensor coupled to one of the sense resistors corresponding to the first DC voltage, and configured to measure a first current value of a current flowing through the sense resistor coupled to the first current sensor, and
   a second current sensor coupled to one of the sense resistors corresponding to the second DC voltage, and configured to measure a second current value of a current flowing through the sense resistor coupled to the second current sensor.

11. The detection apparatus for unbalanced DC link capacitor voltage in claim 10, wherein the first DC voltage and the second DC voltage are acquired by converting an AC voltage by an AC-to-DC converter, or the first DC voltage and the second DC voltage are provided to the AC-to-DC converter and converted into the AC voltage; the AC-to-DC converter is a multi-level converter.

12. The detection apparatus for unbalanced DC link capacitor voltage in claim 10, wherein the first current sensor and the second current sensor are a Hall-effect current sensor or a current sense amplifier.

\* \* \* \* \*